(12) United States Patent
Ishii et al.

(10) Patent No.: US 8,190,063 B2
(45) Date of Patent: May 29, 2012

(54) PATTERN FORMING APPARATUS AND PATTERN FORMING METHOD

(75) Inventors: Koichi Ishii, Kawasaki (JP); Masahiro Hosoya, Okegawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 886 days.

(21) Appl. No.: 12/230,576

(22) Filed: Sep. 2, 2008

(65) Prior Publication Data

US 2009/0053632 A1 Feb. 26, 2009

Related U.S. Application Data

(63) Continuation of application No. PCT/JP2007/053790, filed on Feb. 28, 2007.

(30) Foreign Application Priority Data

Mar. 2, 2006 (JP) .................................. 2006-056502

(51) Int. Cl.
*G03G 15/10* (2006.01)

(52) U.S. Cl. ......................................... 399/242; 430/48

(58) Field of Classification Search .................. 399/242; 430/48

See application file for complete search history.

(56) References Cited

U.S. PATENT DOCUMENTS

| 6,103,082 A | 8/2000 | Ohtsu et al. |
| 6,781,612 B1 * | 8/2004 | Detig ............................. 347/112 |
| 2003/0165347 A1 * | 9/2003 | Sawano ......................... 399/227 |
| 2003/0210318 A1 | 11/2003 | Detig |
| 2006/0280859 A1 * | 12/2006 | Shimizu et al. ................. 427/66 |

FOREIGN PATENT DOCUMENTS

| JP | 4-9902 A | 1/1992 |
| JP | 4-165306 A | 6/1992 |
| JP | 6-265712 A | 9/1994 |
| JP | 9-73091 A | 3/1997 |
| JP | 10-324994 A | 12/1998 |
| JP | 2002-527783 A | 8/2002 |
| JP | 2004-30980 A | 1/2004 |

* cited by examiner

*Primary Examiner* — Peter Vajda

(74) *Attorney, Agent, or Firm* — Oblon, Spivak, McClelland, Maier & Neustadt, L.L.P.

(57) ABSTRACT

A pattern forming apparatus includes a depressed plate holding patterns by developers, a charging device for charging the depressed plate, a developing device for developing a red pattern, a developing device for developing a green pattern, a developing device for developing a blue pattern, and a stage for holding the charging device and the developing devices and moving them relative to the depressed plate. The charging device, the red developing device, the green developing device and the blue developing device pass along the depressed plate sequentially to perform the charging process, the red developing process, the green developing process and the blue developing process simultaneously.

1 Claim, 13 Drawing Sheets

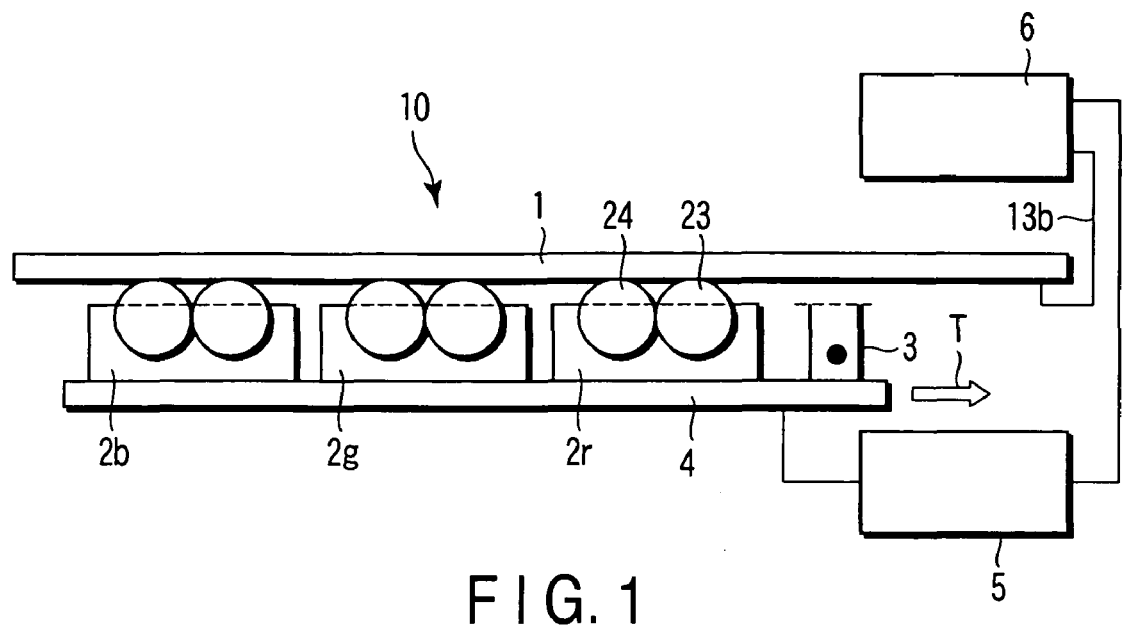
F I G. 1
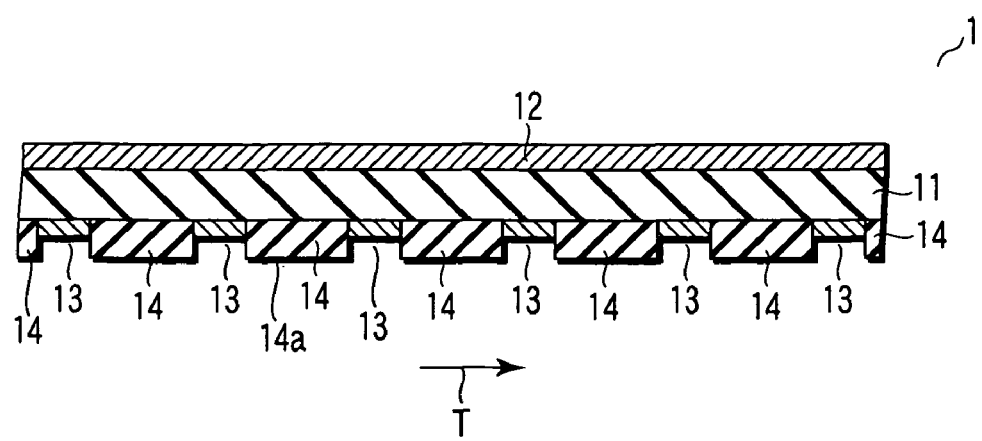
F I G. 2

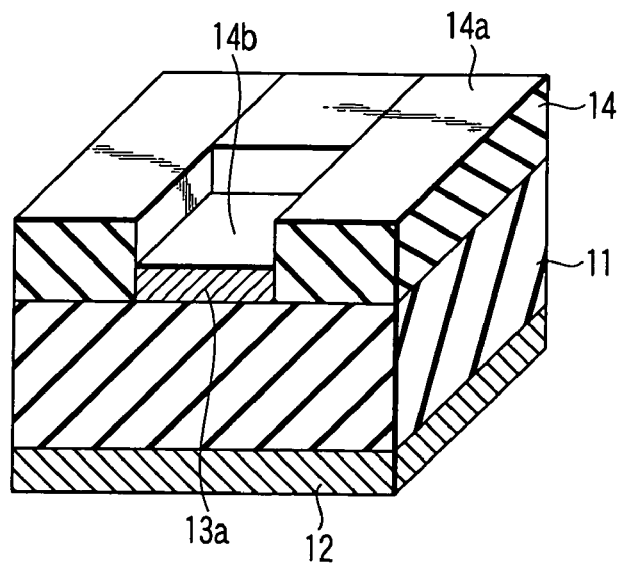
F I G. 3
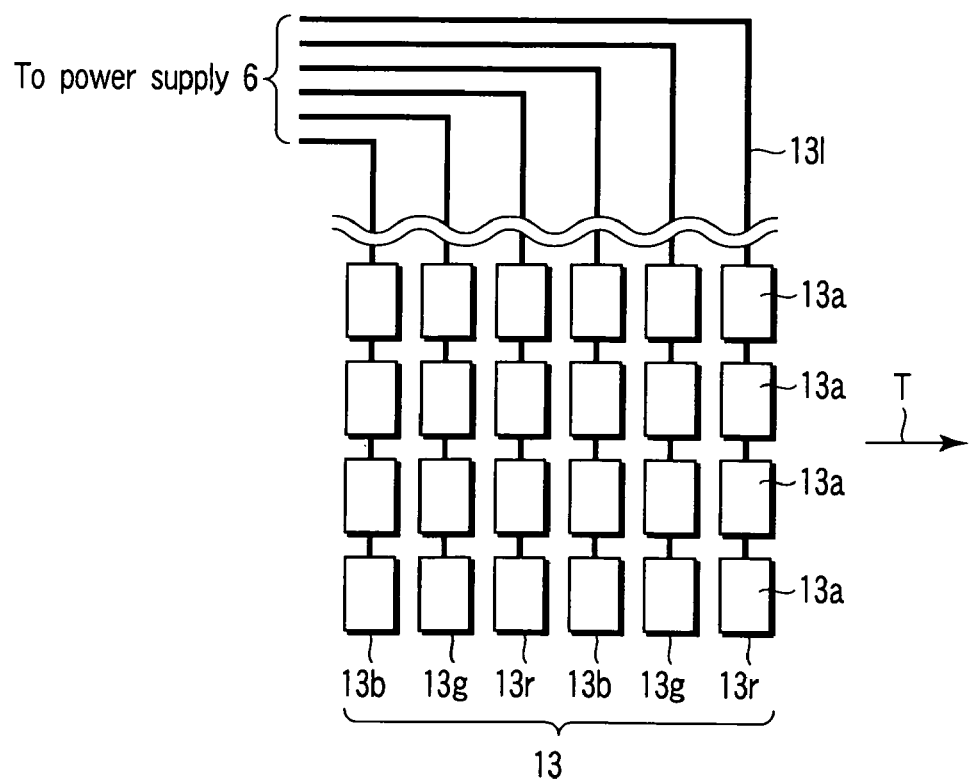
F I G. 4

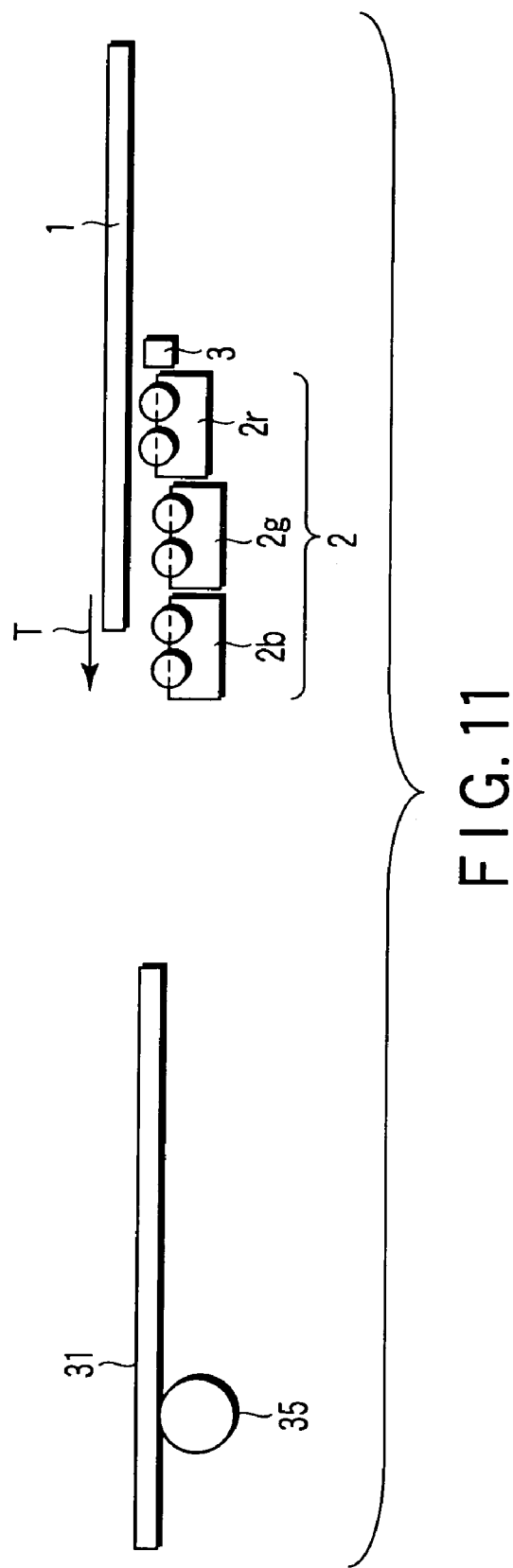
F I G. 11

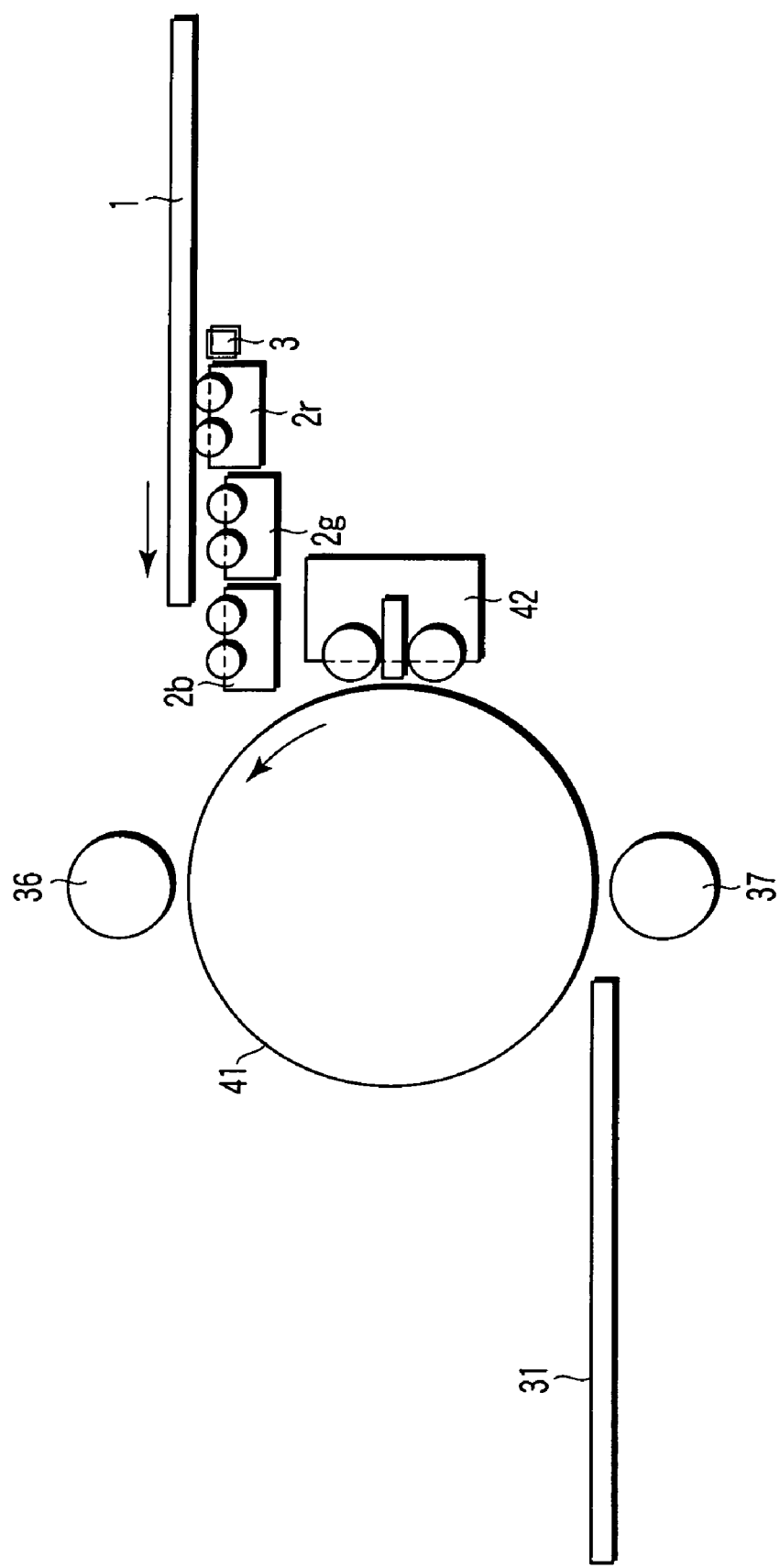
F I G. 12

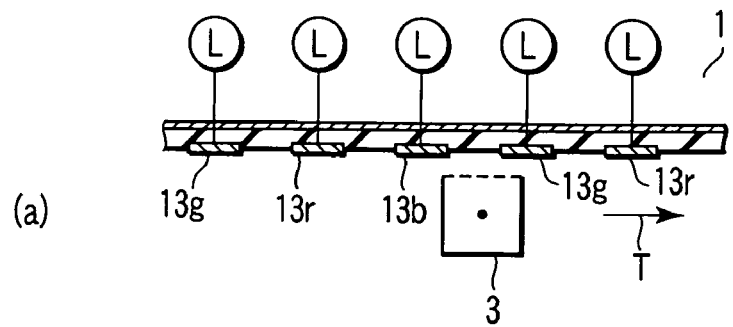
(a)
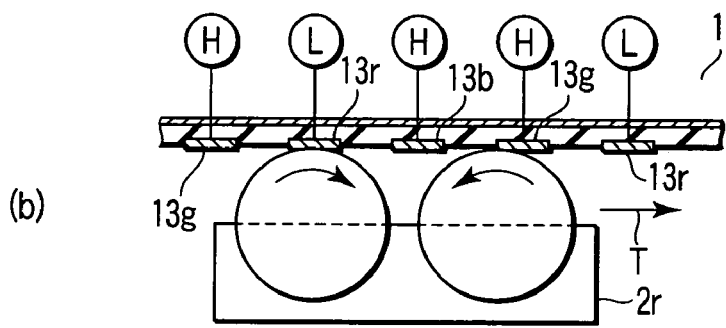
(b)
FIG. 13
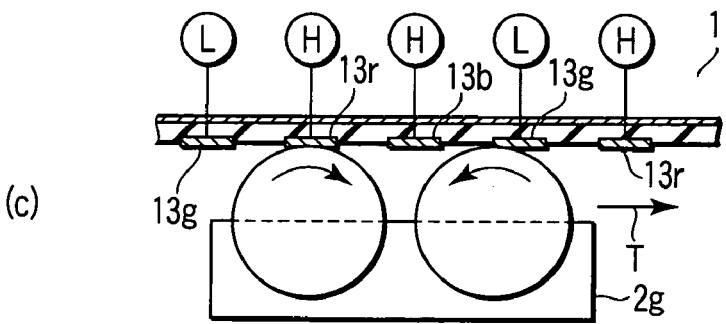
(c)
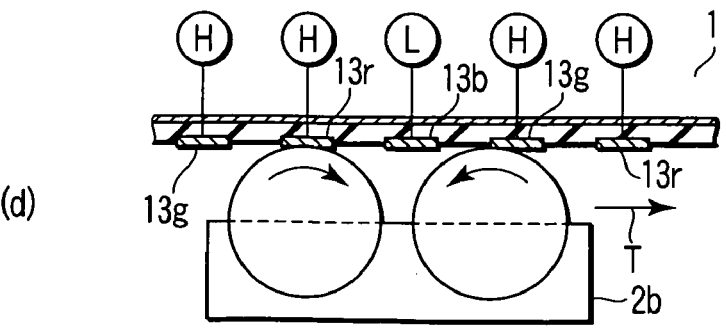
(d)

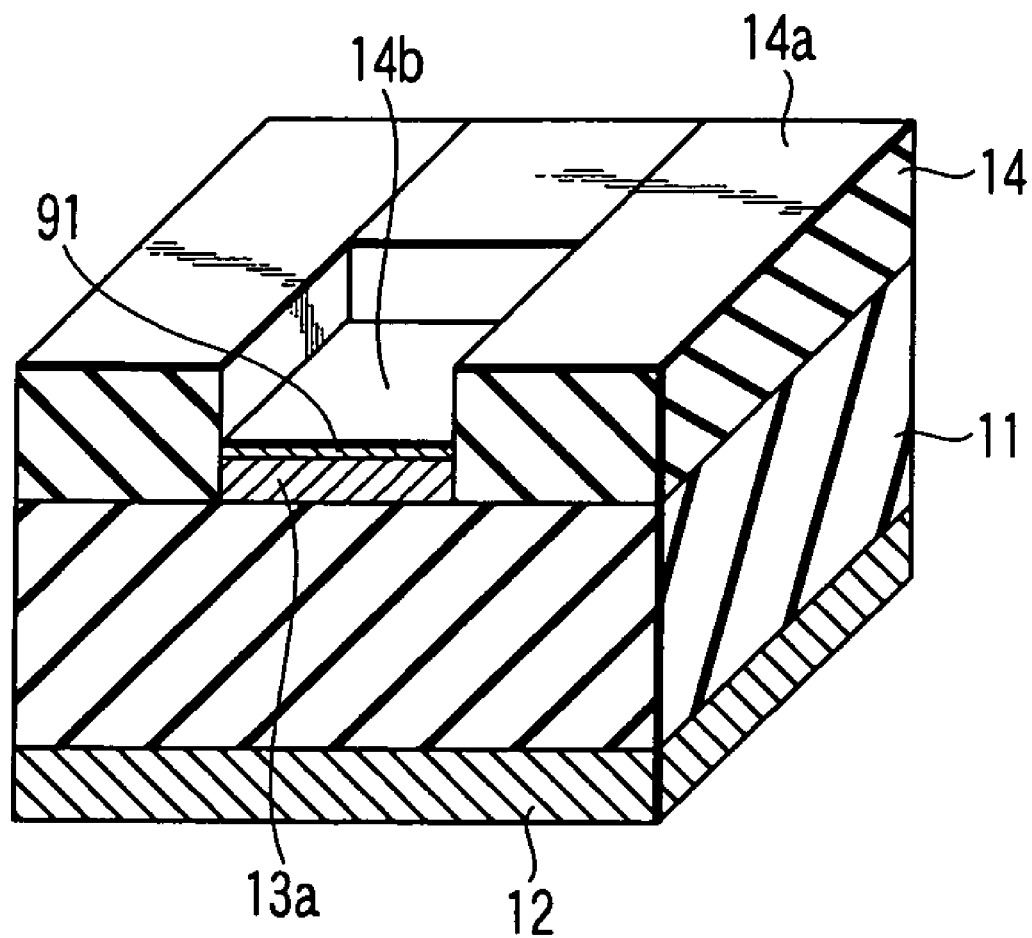
F I G. 20

PATTERN FORMING APPARATUS AND PATTERN FORMING METHOD

CROSS REFERENCE TO RELATED APPLICATIONS

This is a Continuation Application of PCT Application No. PCT/JP2007/053790, filed Feb. 28, 2007, which was published under PCT Article 21(2) in Japanese.

This application is based upon and claims the benefit of priority from prior Japanese Patent Application No. 2006-056502, filed Mar. 2, 2006, the entire contents of which are incorporated herein by reference.

BACKGROUND OF THE INVENTION

1. Field of the Invention

The present invention relates to a pattern forming apparatus and a pattern forming method used in, for example, manufacturing a flat panel display, wiring board, IC tag and the like.

2. Description of the Related Art

Conventionally, photolithography plays a main role in forming a fine pattern on a base material surface. However, while this photolithography asks higher resolution or greater performance, it needs huge and highly-expensive manufacturing equipment and its manufacturing cost becomes higher according to the resolution.

Meanwhile, in the field of manufacturing a semiconductor device, an image display and the like, there are increasing demands for performance improvement and lower costs, and it is difficult for the above-mentioned photolithography to meet these needs. In such a situation, attention is being paid to a pattern forming technique using digital printing technique.

On the other hand, for example, the inkjet technique is being brought into practical use as a patterning technique taking advantage of a simple apparatus and non-contact patterning. However, there are limits in increasing the resolution and productivity. In other words, in this point, the electrophotographic system, or particularly, the electrophotographic system using liquid toner, has excellent potential.

For example, there is proposed a method of using electrophotographic system to form a color filter, black matrix, phosphor layer for a flat panel display front board and the like (see, for example, Jpn. Pat. Appln. KOKAI Publication Nos. 2004-30980 and 6-265712).

However, in the field of flat panel displays, there is an increasing demand for higher resolution and formation of a pattern of higher resolution with higher positional accuracy. However, this need cannot be satisfied by the above-mentioned electrophotographic system. This is because the resolution of the writing optical system is about 1200 dpi at most, which is not enough to assure higher resolution and higher positional accuracy. In addition, there is a problem that the wide wiring optical system for recent larger-sized displays cannot yet be realized.

On the other hand, there has been proposed a method for forming a pattern of phosphor or the like on a display front glass by using an electrostatic printing plate having patterns of different electrical resistance on the surface in place of photoreceptor, making liquid toner act on this plate to develop a pattern and transcribe this pattern image onto a glass plate (see, for example, Jpn. Pat. Appln. KOKAI Publication No. 2002-527783).

However, after the inventors of the present application carried out experiments and studied intensively, they found the following substantial problems of this method.

First, the developed image with use of liquid toner often has a film thickness of 1 μm or less, and is not suitable for thick film formation such as phosphor layer and color filter of a display. Hence, there needs to be further new ideas if the liquid toner is used to realize highly-accurate thick film forming.

In addition, when a corona charger is used to transfer the developed image onto the glass plate, corona charge propagates on the glass surface and is leaked, which tends to cause unstable transfer performance. In addition, a space charge tends to be stored inside the glass and it is difficult to form a transfer electric field that is stronger than this space charge in the corona transfer. Further, this problem is exacerbated after a first color developed image is transferred, which makes it more difficult to transfer the second and third color developed images onto the glass plate.

Further, in the method of using an electrostatic printing plate, it is difficult to develop image of plural colors at the same time, which makes it necessary to perform development and transferring process for each color. This presents problems of longer processing time for one-time print and lower operation rate.

BRIEF SUMMARY OF THE INVENTION

An object of the present invention is to provide a pattern forming apparatus and a pattern forming method capable of forming a pattern of higher thickness with higher resolution and higher positional accuracy.

In addition, another object of the present invention is to provide a pattern forming apparatus and a pattern forming method capable of shortening processing time for development thereby to improve operation rate of the apparatus.

In order to attain these objects, a pattern forming apparatus of the present invention comprises: a plate having a first pattern electrode and a second pattern electrode which are electrically isolated from each other; a first developing device which supplies the plate via a first supplying member with a first liquid developer which is insulating liquid having charged first developer particles in suspension and forms a first potential difference between the first supplying member and the first pattern electrode to gather the first developer particles in the first liquid developer at the first pattern electrode to perform development; a second developing device which supplies the plate via a second supplying member with a second liquid developer which is insulating liquid having charged second developer particles in suspension and forms a second potential difference between the second supplying member and the second pattern electrode to gather the second developer particles in the second liquid developer at the second pattern electrode to perform development; and a transfer device which forms a third potential difference between the first pattern electrode and the second pattern electrode and a transfer target medium while the plate of which the first developer particles are gathered and developed on the first pattern electrode and the second developer particles are gathered and developed on the second pattern electrode is placed opposed to the transfer target medium, and transfers the first developer particles gathered on the first pattern electrode and the second developer particles gathered on the second pattern electrode onto the transfer target medium.

Further, a pattern forming apparatus of the present invention comprises: a plate having a plurality of pattern electrodes arranged electrically isolated from each other; a power supply which applies voltages to said plurality of pattern electrodes independently; a first developing device which supplies the plate via a first supplying member with a first liquid developer which is insulating liquid having charged first developer particles in suspension and uses a first electric field formed between the first supplying member and a first pattern electrode given a first voltage by the power supply to gather the first developer particles in the first liquid developer at the first pattern electrode to perform development; a second developing device which supplies the plate via a second supplying member with a second liquid developer which is insulating liquid having charged second developer particles in suspension and uses a second electric field formed between the second supplying member and a second pattern electrode given a second voltage by the power supply to gather the second developer particles in the second liquid developer at the second pattern electrode to perform development; and a transfer device which forms a third electric field between the first pattern electrode and the second pattern electrode and a transfer target medium while the plate of which the first developer particles are gathered and developed on the first pattern electrode and the second developer particles are gathered and developed on the second pattern electrode is placed opposed to the transfer target medium, and transfers the first developer particles gathered on the first pattern electrode and the second developer particles gathered on the second pattern electrode onto the transfer target medium.

Furthermore, a pattern forming method of the present invention comprises: a step of preparing a plate having a first pattern electrode and a second pattern electrode which are electrically isolated from each other; a first developing step of supplying the plate via a first supplying member with a first liquid developer which is insulating liquid having charged first developer particles in suspension, applying a first voltage to the first pattern electrode to form a first electric field between the first supplying member and the first pattern electrode and using the first electric field to gather the first developer particles in the first liquid developer at the first pattern electrode to perform development; a second developing step of supplying the plate via a second supplying member with a second liquid developer which is insulating liquid having charged second developer particles in suspension, applying a second voltage to the second pattern electrode to form a second electric field between the second supplying member and the second pattern electrode and using the second electric field to gather the second developer particles in the second liquid developer at the second pattern electrode to perform development; and a transfer step of forming a third electric field between the first pattern electrode and the second pattern electrode and a transfer target medium while the plate on which the first developer particles and the second developer particles are developed is placed opposed to the transfer target medium, and collectively transferring the first developer particles gathered on the first pattern electrode and the second developer particles gathered on the second pattern electrode onto the transfer target medium.

BRIEF DESCRIPTION OF THE SEVERAL VIEWS OF THE DRAWING

FIG. 1 is a schematic view illustrating substantial parts of a pattern forming apparatus according to a first embodiment of the present invention.

FIG. 2 is a partially enlarged cross sectional view of a depressed plate used in the pattern forming apparatus of FIG. 1.

FIG. 3 is a partially enlarged perspective view for explaining the structure of one depressed part of the depressed plate of FIG. 2.

FIG. 4 is a schematic view partially illustrating a plurality of pattern electrodes provided on the depressed plate of FIG. 2.

FIG. 11 is a schematic view illustrating a modified example of the pattern forming apparatus of FIG. 1.

FIG. 12 is a schematic view for explaining a structure example using an intermediate transfer medium.

FIG. 13 is an operation explaining view for explaining the operation of parallel-processing of the charging process and the developing processes of each color on the depressed plate.

FIG. 20 is a partially enlarged perspective view illustrating an example of a functional layer provided at the bottom of the depressed part of FIG. 3.

DETAILED DESCRIPTION OF THE INVENTION

Figure 5:
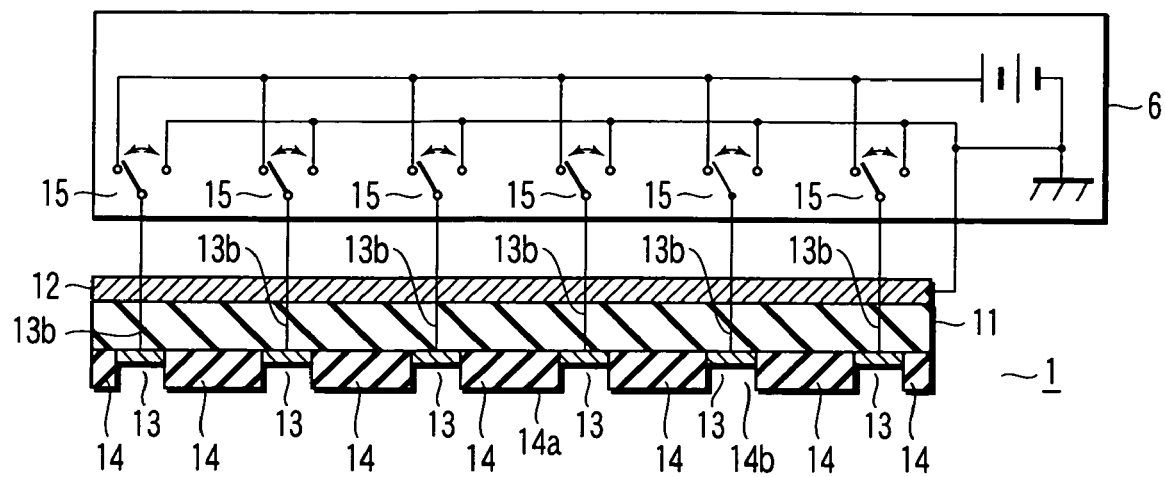
FIG. 5 is a view for explaining the structure of a power supply for controlling switching of voltages to be applied to the pattern electrodes of FIG. 4.

With reference to the drawings, embodiments of the present invention will now be described in detail below.

FIG. 1 schematically illustrates the structure of substantial parts of a pattern forming apparatus 10 according to a first embodiment of the present invention. The pattern forming apparatus 10 described here is, for example, an apparatus for forming a color filter and a phosphor layer on the inner surface of a display panel of a flat panel display.

The pattern forming apparatus 10 has a flat depressed plate 1 as a plate of this invention; plural developing devices 2r, 2g and 2b (which are sometimes collectively called developing devices 2 below), arranged below the depressed plate 1 in the figure and closely opposed to the depressed plate 1, for supplying the depressed plate 1 with liquid developers of colors (r: red, g: green, b: blue) to perform development; a charging device 3 for charging a surface 14a of a high-resistance layer 14 (which is described later) of the depressed plate 1 at a predetermined potential; and a stage 4 holding the charging device 3 and the plural developing devices 2. In addition, the pattern forming apparatus 10 has a controller 5 (moving mechanism) for moving the stage 4 in the direction of the arrow T in the figure relative to the depressed plate 1 while maintaining a gap between the developing devices 2 and the depressed plate 1; and a power supply 6 for applying a voltage to each pattern electrode 13 described below of the depressed plate 1 based on a control signal output from the controller 5. In addition, this pattern forming apparatus 10 has a transfer apparatus 30 described below and not shown in FIG. 1.

FIG. 2 shows a partial cross sectional view of the above-described depressed plate 1. The depressed plate 1 has an insulating substrate 11; a common electrode 12 provided on the back surface of the substrate 11 away from the developing devices 2; plural pattern electrodes 13 provided on the front surface of the substrate 11; and a high-resistance layer 14 partially covering and defining the plural pattern electrodes 13 and forming depressed parts 14b as pixel units described below.

The substrate 11 is formed of a glass material or resin material such as polyimide, PET (polyethylene terephthalate), or PEN (polyethylene naphthalate) and has a thickness of about 20 to 50 μm. The common electrode 12 is formed of, for example, a conductive material such as stainless steel or aluminum and has a thickness of about 100 to 3000 μm. The high-resistance layer 14 is formed of a material having a volume resistance rate of $10^{10}$ Ωcm or more such as nylon, Teflon (registered trademark), epoxy, urethane, polyester, acrylic or polyimide, and has a thickness of about 10 to 30 μm, or preferably, 20±5 μm.

Each pattern electrode 13 is patterned on the surface of the substrate 11 as shown in FIG. 4. The pattern electrodes 13 of this embodiment have plural same patterns arranged in the relative moving direction T of the depressed plate 1 and the stage 4. The pattern electrodes 13 are electrically isolated from each other and patterned in parallel with each other. Each pattern electrode 13 has plural rectangular portions 13a each corresponding to one pixel of the display panel, which are connected by a long and thin wire 131. In the depressed plate 1 used in an apparatus for forming a color filter or a phosphor layer of a display panel of this embodiment, the plural pattern electrodes 13 are classified into red pattern electrodes 13r, green pattern electrodes 13g and blue pattern electrodes 13b, and these are arranged in this order alternately.

Then, the high-resistance layer 14 has a plurality of depressed parts 14b exposing all the rectangular portions 13a of the respective pattern electrodes 13. In other words, the high-resistance layer 14 has the wire portions 131 partially covered of the plural pattern electrodes 13 patterned on the surface of the substrate 11 and the rectangular portions 13a exposed to the surface side. FIG. 3 shows a partially enlarged cross sectional view of a depressed part 14b of the high-resistance layer 14 of which the rectangular part 13a of the pattern electrode 13 is exposed. The depth of each depressed part 14b is close to the thickness of the high-resistance layer 14.

Here, a functional layer 91 as shown in FIG. 20 may be arranged on each bottom of the depressed parts 14b. This functional layer 91 may be a peel layer for promoting toner peeling when transferring or an insulating layer for preventing discharge. In the example illustrated in FIG. 20, the functional layer 91 is formed of fluorocarbon resin or silicon resin, having a film thickness of about 0.1 to 2 μm.

Each pattern electrode 13 is connected to the power supply 6 as shown in FIG. 5, which applies different voltages independently to the pattern electrodes 13. In this embodiment, the pattern electrodes 13 are connected to respective switches 15 so that the voltage applied to each pattern electrode 13 is independently switchable between the power supply voltage (+200V in this embodiment) and ground voltage (0V). In addition, in the power supply 6, the common electrode 12 is connected to ground (0V). Here, the voltage applied to each pattern electrode 13 may not be switched between two voltage levels as described in this embodiment, but a volume control function may be provided to apply any voltage independently to each pattern electrode 13.

Figure 6:
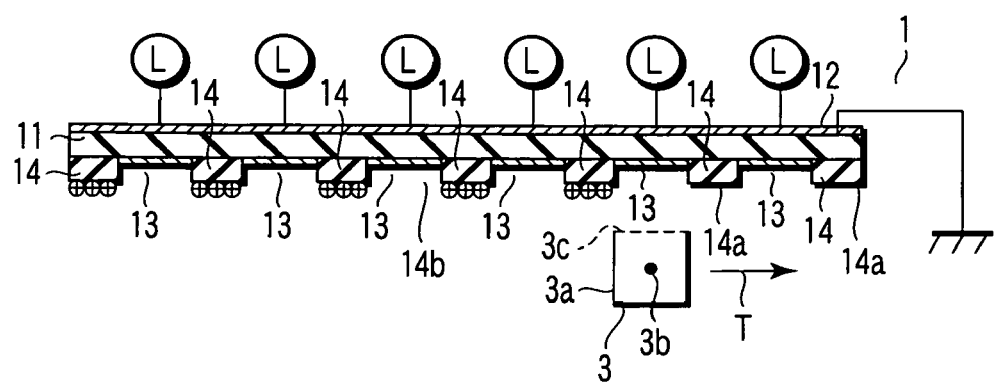
FIG. 6 is an operation explaining view for explaining the charging process of the depressed plate of FIG. 2.

In this embodiment, the charging device 3 used is a scorotron charging device having a charging case 3a, a charging wire 3b and a grid electrode 3c as shown in FIG. 6. However, instead of the scorotron charging device, the charging device 3 may be a corotron charging device having no grid electrode 3c, an ion generator that does not use wire or the like. In any case, the charging device 3 is arranged opposed to the surface 14a of the high-resistance layer 14 of the depressed plate 1 with a gap of 1 to 2 mm interposed therebetween and moved in the direction crossing the abovementioned pattern electrodes 13 (in the direction of the arrow T) in response to the movement of the stage 4.

Figure 7:
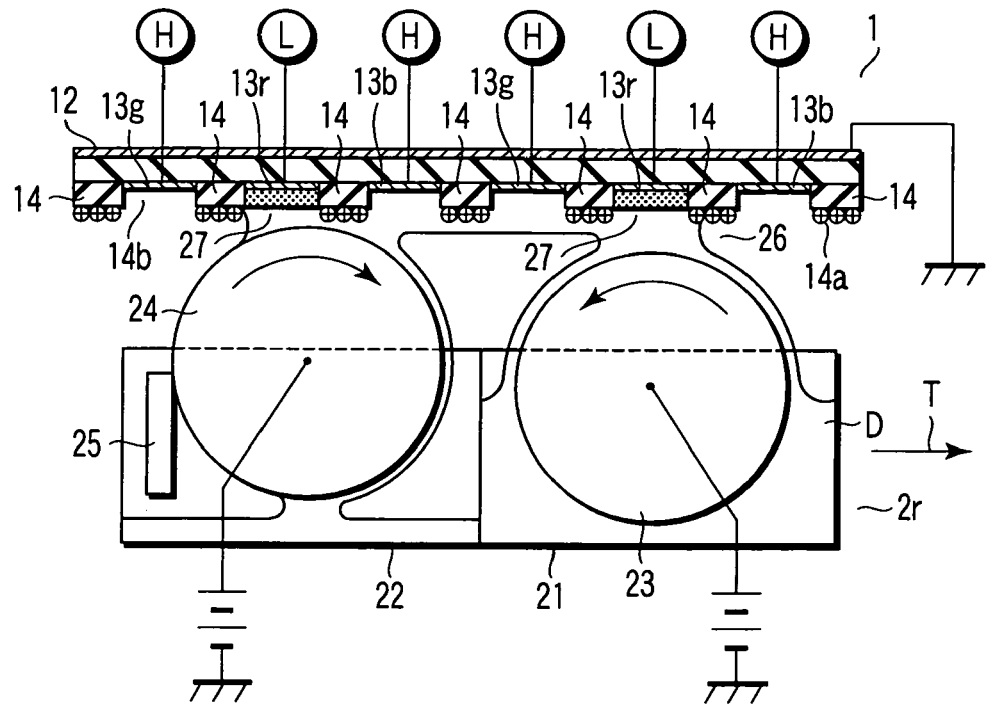
FIG. 7 is an operation explaining view for explaining the first-color developing process on the depressed plate of FIG. 2.
Figure 8:
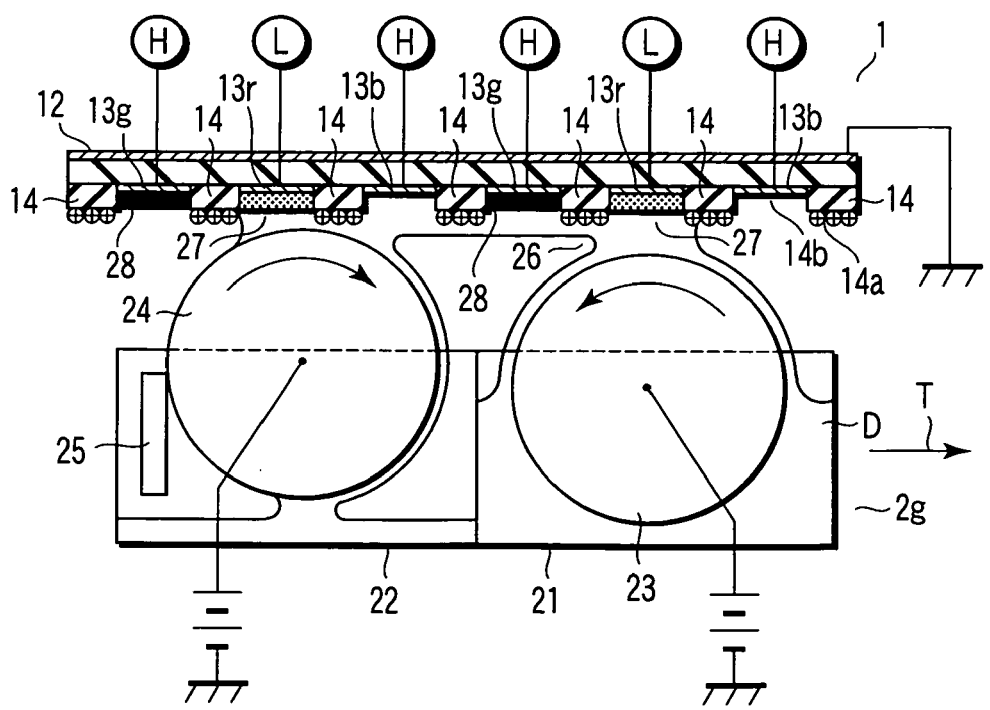
FIG. 8 is an operation explaining view for explaining the second-color developing process on the depressed plate of FIG. 2.

FIGS. 7 and 8 are enlarged views schematically illustrating the structure of the developing device 2. The above-mentioned developing devices 2r, 2g and 2b have the same structure except the color of the used liquid developer. Therefore, the developing device 2r, 2g and 2b are described here as the developing device 2.

The developing device 2 has two housings 21 and 22 arranged along the moving direction T relative to the depressed plate 1. In the housing 21 arranged in the downstream side of the moving direction, there is provided a developing roller 23 serving as a supplying member of this invention. The developing roller 23 has a peripheral surface arranged facing the surface 14a of the high-resistance layer 14 of the depressed plate 1 with a gap of about 100 to 200 μm interposed therebetween, and rotates in the counterclockwise direction in the figure. In the housing 22 arranged in the upstream side of the moving direction, there is provided a squeeze roller 24. The squeeze roller 24 has a peripheral surface arranged at the position more closely facing the depressed plate 1 than the developing roller 23, that is, arranged about 30 to 60 μm away from the surface 14a of the high-resistance layer 14. The squeeze roller 24 rotates in the clockwise direction in the figure. The squeeze roller 24 partially removes the liquid developer supplied to the depressed plate 1 by the developing roller 23 and controls the thickness of the liquid developer remaining on the depressed plate 1. On the peripheral surface of the squeeze roller 24, there is a cleaning blade 25 made of a rubber segment arranged in contact.

The liquid developer D is held in a developer tank (not shown) and supplied into the housing 21 via a nozzle (not shown) by a pump (not shown) or the like. The liquid developer D inside the housing 21 is supplied to the depressed plate 1 via the developing roller 23. Out of the liquid developer supplied to the depressed plate 1, an excessive, unnecessary liquid developer is collected in the housing 22 via the squeeze roller 24 and the cleaning blade 25 and discharged into a collection tank (not shown) via a nozzle (not shown) by a pump (not shown) or the like. The liquid developer D has dye particles (developer particles) in suspension such as pigment and dye and fluorescent particles of each color charged in the insulating liquid. The developer particle of each color contains metal soap or the like so that it becomes positively charged.

The developing devices 2r, 2g and 2b and the charging device 3 held on the stage 4 are moved in the direction of the arrow T along the surface of the depressed plate 1 by moving the stage 4 in the direction of the arrow T relative to the depressed plate 1 under the control of the controller 5. At this time, the stage 4 is moved approximately in parallel to the surface of the depressed plate 1 so as to maintain a gap held between the depressed plate 1 and the developing device 2 and a gap held between the depressed plate 1 and the charging device 3.

Next description is given about the operation of the above-described pattern forming apparatus 10 with reference to FIGS. 6 to 10.

First, as shown in FIG. 6, the controller 5 moves the stage 4 (not shown) at a fixed speed to move the charging device 3 in the direction of the arrow T relative to the depressed plate 1 at the fixed speed, whereby the surface 14a of the high-resistance layer 14 of the depressed plate 1 is charged. At this time, settings of the switch 15 of the power supply 6 are changed so that the common electrode 12 and all pattern electrodes 13 of the depressed plate 1 are at ground potential (0V). With this structure, the charge applied to the pattern electrodes 13 flows to ground, and consequently, only the surface 14a of the high-resistance layer 14 is charged as shown in the figure. In this embodiment, the charging wire 3b is applied with a direct current voltage of, for example, about +6[KV] and the charging case 3a and the grid electrode 3c are applied with a direct current voltage of, for example, about +300V, and thereby the surface 14b of the high-resistance layer 14 of the depressed plate 1 is charged to, for example, +400V.

In addition, at this time, the developing devices 2r, 2g and 2b held by the stage 4 move in the direction of the arrow T, and, in parallel with the charging operation of the depressed plate 1, supply liquid developers of the respective colors to develop the pattern electrodes 13 of the corresponding colors. In other words, the parts of the depressed plate 1 charged by the charging device 3 are developed with respective colors sequentially.

FIG. 7 is an operation explaining view for explaining the developing operation of a first color (red) performed in parallel with the charging operation. When the red pattern electrode 13r is supplied with red liquid developer to perform development, pattern electrodes 13r corresponding to the red pixel among the plural pattern electrodes 13 (see FIG. 4) of the depressed plate 1 are switched to ground potential (0V) (low level) and the remaining pattern electrodes 13g and 13b are switched to the power supply potential (+200V in the present embodiment) (high level). Specifically, when the three-color phosphor layer of the display pattern is formed, red, green and blue pixels are arranged alternately. Therefore, as shown in FIG. 7, every three electrodes of the plural pattern electrodes 13 are given a low-level voltage.

In this state, the developing roller 23 of the developing device 2r is rotated in counterclockwise direction and the red liquid developer D held in the housing 21 is adhered to the roller peripheral surface and rolled up. At this time, the developing roller 23 is rotated at the rotational speed 2 to 5 times greater than the moving speed of the developing device 2r by the stage 4. The liquid developer D rolled up by the roller peripheral surface is spread wetly to between the roller and the depressed palate 1 that is placed a given gap away from the roller, and there are formed nipples 26 full of the liquid developer D therebetween.

Then, when the developing roller 23 is given a direct bias voltage, for example, of about +200V, there is generated an electric field from the developing roller 23 toward the red pattern electrodes 13r in the nipple 26. Then, there are generated an electrical field from the surface 14a of the high-resistance layer 14 charged +400V to the developing roller 23 and an electric field from the pattern electrodes 13g and 13b of the other colors (green and blue in this case) switched to the high level of +400V to the developing roller 23.

With this, the developer particles positively charged flowing in the liquid developer inside the nipple 26 are subjected to a repulsive force from the surface 14a of the high-resistance layer 14 with the operation of the electric field from the surface 14a of the high-resistance layer 14 to the developing roller 23 and also to a repulsive force from the pattern electrodes 13g and 13b by the operation of the electric field from the green pattern electrodes 13g and the blue pattern electrodes 13b to the developing roller 23. The developer particles are attracted only by the red pattern electrodes 13r by the operation of the electric field from the developing roller 23 to the red pattern electrodes 13r.

As a result, as shown in FIG. 7, the red developer particles are gathered at a relatively high concentration only in the depressed parts 14b that have red pattern electrodes 13r at the respective bottoms, and a red pattern 27 is developed. Here, the shape of the pattern 27 developed then is a shape corresponding to the shape of the depressed parts 14b of the high-resistance layer 14. Therefore, the shape becomes plural rectangular patterns having approximately the same thickness of the high-resistance layer 14. That is, the rectangular patterns having approximately the same size as the rectangular parts 13a of the pattern electrodes 13r of corresponding color are arranged in matrix.

After the red pattern 27 is developed by the developing roller 23, unnecessary liquid developer D is removed from the surface of the depressed plate 1 by the nipples 26. Then, the potential of each pattern electrode 13 during the above-mentioned development is kept as it is, the squeeze roller 24 of the developing device 2r is rotated in the clockwise direction in the figure and is applied with a direct-current bias voltage of, for example, +50 to +200V. In this embodiment, the squeeze roller 24 is rotated in the reverse direction of the developing roller 23 at a speed one to three times greater than the moving speed of the developing device 2r.

The liquid developer D positioned in a gap between the depressed plate 1 and the squeeze roller 24 contains a lower concentration of developer particles immediately after it passes through the developing roller 23. This light unnecessary liquid developer is acted upon by the electric field from the squeeze roller 24 to the red pattern electrodes 13r, the electric field from the surface 14a of the high-resistance layer 14 to the squeeze roller 24 and the electric field from the green pattern electrodes 13g and the blue pattern electrodes 13b to the squeeze roller 24. With this action, a small amount of developer particles floating in the unnecessary liquid developer are attracted only by the red pattern electrodes 13r. Needless to say, the red developer particles attracted by the pattern electrodes 13r are acted upon by the electric field in the direction of pressing toward the pattern electrodes 13r. Therefore, there is no need to worry about shedding.

As the squeeze roller 24 rotates in the reverse direction to the moving direction relative to the depressed plate 1, the unnecessary liquid developer placed between the depressed plate 1 and the squeeze roller 24 is acted upon by the fluid operation and the unnecessary liquid developer is rolled up by the peripheral surface of the squeeze roller 24 and collected inside the housing 22. At this time, the unnecessary developer particles biased in the direction away from the depressed plate 1 under the operation of the above-mentioned electric field are also collected inside the housing 22 by rotation of the squeeze roller 24 together with unnecessary liquid developer. In other words, only the insulating liquid of the liquid developer is mainly adhered to the surface 14 of the depressed plate 1 having passed through the squeeze roller 24.

Here, the unnecessary liquid developer adhered to the surface of the squeeze roller 24 and collected thereby tries to move toward the depressed plate 1 again; however, it is scratched down into the housing 22 by the cleaning blade 25 that is pressed onto the surface of the squeeze roller 24. The unnecessary liquid developer thus collected in the housing 22 is collected in a tank (not shown) by a pump (not shown).

After that, as shown in FIG. 8, the green developing device 2g is used to perform developing operation of the second color (green) onto the depressed plate 1. This second color developing operation is performed in parallel with charging operation, like the first color developing operation, and the first color developing operation. As its basic operation is approximately the same as the above-mentioned red color developing operation, only different parts will be explained below.

First, in an area facing the developing device 2g of the depressed plate 1, the green pattern electrodes 13g adjacent to the red pattern electrodes 13r are given the low-level ground voltage (0V) and the other pattern electrodes 13r and 13b are given a high-level power supply voltage (+200V). In addition, the developing roller 23 and the squeeze roller 24 are given a direct-current bias voltage of about +200V.

When the developing roller 23 is rotated in this state, nipples 26 are formed at parts of the depressed plate 1 facing the developing roller 23. Then, inside the nipples 26, an electric field from the developing roller 23 toward the pattern electrode 13g is formed. The developer particles flowing in the green liquid developer are gathered inside the depressed parts 14b of the pattern electrodes 13g and the green patterns 28 are formed. At this time, there are formed an electric field from the surface 14a of the high-resistance layer 14 toward the developing roller 23, and an electric field from the pattern electrodes 13r and 13b of the other colors not involved in the development toward the developing roller 23, whereby the green developer particles are prevented from being adhered to other parts of the depressed plate 1.

However, if the strong electric field is formed from the red pattern electrodes 13r toward the developing roller 23 inside the depressed parts 14b where the red developer particles are gathered, the developer particles may be shed from the depressed parts 14b. If there is such a concern, the voltage given to the red pattern electrodes 13r can be set close to a voltage given to the developing roller 23.

After that, the blue developing device 2b is used to supply the blue liquid developer to the depressed plate 1 and in the same manner, the blue developer particles are gathered in the depressed parts 14b of the high-resistance layer 14 having the blue pattern electrodes 13b to develop the blue pattern 29. This developing operation by the blue developing device 2b is also performed in parallel with the other process including the charging operation, like the developing operations of the other colors.

Figure 9:
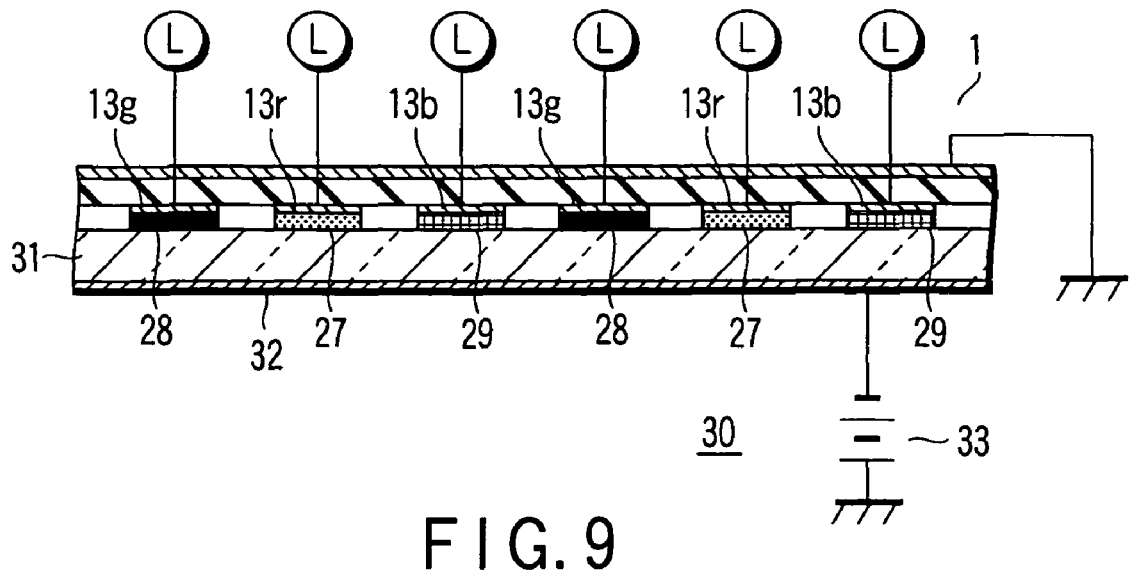
FIG. 9 is an operation explaining view for explaining the transfer process of transferring patterns onto a transfer target medium from the depressed plate after completion of the developing processes.

As described up to this point, after development of all the colors is finished, as shown in FIG. 9, the depressed plate 1 holding the respective color patterns 27, 28 and 29 is arranged closely facing an insulating transfer target medium 31, and all the patterns 27, 28 and 29 are collectively transferred onto the transfer target medium 31. At this time, the depressed plate 1 and the transfer target medium 31 face each other with a small gap interposed therebetween, where there is preferably insulating liquid of the liquid developer. Here, in the present embodiment, the transfer target medium 31 is a front surface substrate of the display panel and is a rectangular plate-shaped glass plate.

The depressed plate 1 and the transfer target medium 31 are placed in registration while facing each other with the small gap therebetween. At this time, the registration is not required between the respective color patterns 27, 28 and 29, and therefore the registration can be made with high accuracy. In other words, the respective color patterns 27, 28 and 29 take shapes approximately depending on the shapes of the depressed parts 14b of the high-resistance layer 14 of the depressed plate 1, and therefore, registration between colors is not needed in this embodiment.

The transfer device 30 for transferring the respective color patterns 27, 28 and 29 of the depressed plate 1 onto the transfer target medium 31 has an opposite electrode 32 arranged to the back surface side of the transfer target medium 31 away from the depressed plate 1, and a power supply 33 for applying a fixed voltage to the opposite electrode 32. The opposite electrode 32 can be peeled off from the back surface of the transfer target medium 31 after completion of the transfer operation.

Figure 10:
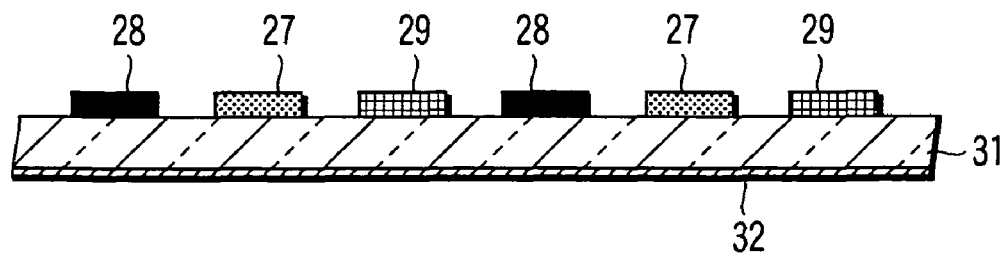
FIG. 10 is a view illustrating the patterns transferred on the transfer target medium by the transfer process of FIG. 9.

During the transfer process, in the transfer device 30 as shown in FIG. 9, the depressed plate 1 and the transfer target medium 31 are opposed to each other while all the pattern electrodes 13 of the depressed plate 1 are given a low-level voltage (0V), and the power supply 33 is used to apply a bias voltage of, for example, about −10 kV to the opposite electrode 32. With this structure, there is formed a comparatively strong transfer electric field from all the pattern electrodes 13 toward the opposite electrode 32, and as shown in FIG. 10, all the patterns 27, 28 and 29 held on the depressed plate 1 are transferred onto the surface of the transfer target medium 31. Finally, the opposite electrode 32 is separated from the back surface of the transfer target medium 31 and then, the transfer target medium 31 with the respective color patterns 27, 28 and 29 transferred thereon can be obtained.

As described up to this point, according to the present embodiment, after developer particles of the respective colors are gathered and developed in the large number of depressed parts 14b on the surface of the depressed plate 1, the respective color patterns 27, 28 and 29 can be collectively transferred onto the transfer target medium 31. Particularly, in this embodiment, as developing and transfer processes can be carried out by controlling voltages to be applied to the plural pattern electrodes 13 provided in the depressed plates 1, stable transfer is allowed because there is no need to perform plural transfer operations with use of a corona charger. Further, according to this embodiment, it is possible to provide a manufacturing apparatus suitable for manufacturing of a display panel of a comparatively large-sized flat panel display. Furthermore, the present embodiment is suitable for forming of comparatively thick patterns, as the patterns 27, 28 and 29 can be formed having a thickness corresponding to the thickness of the high-resistance layer 14 of the depressed plate 1.

Here, the above-described embodiment handles a case of moving the charging device 3 and the developing devices 2 set on the stage 4 relative to the depressed plate 1. However, the present invention is not limited to this case, and for example, as shown in FIG. 11, the developing devices 2 and the charging device 3 may be arranged fixedly, and the depressed plate 1 may be moved in the direction of the arrow T in the figure thereby to perform developing processes. In this case, in the later transfer process, the transfer roller 35 waiting in the moving direction of the depressed plate 1 can be used to transfer the patterns 27, 28 and 29 onto the transfer target medium 31, and the depressed plate 1 can be moved automatically to the transfer device.

Further, as shown in FIG. 12, an intermediate transfer medium made of an elastic material may be used. That is, a drum-shaped intermediate transfer medium 41 is arranged in the downstream of the moving direction of the depressed plate 1 that has passed the charging device 3 and the three color developing devices 2, the respective color patterns 27, 28 and 29 are collectively transferred onto the peripheral surface of this intermediate transfer medium 41 via the transfer roller 36 and these color patterns are transferred onto the transfer target medium 31 by the transfer roller 37. In such a case, each time the pattern transfer onto the transfer target medium 31 is finished, the peripheral surface of the intermediate transfer medium 41 is cleaned with a cleaner 42.

Further, the above-described embodiment handles a case where a relatively thicker high-resistance layer 14 for partially coating the pattern electrodes 13 of the depressed plate 1 is provided to form relatively thicker patterns depending on the depth of the depressed parts 14b. However, this is not for limiting the present invention, and the depressed parts 14b are not indispensable for the present invention.

Next description is given about the above-mentioned charging operation and developing operation, more specifically, from the viewpoint of the parallel processing.

As described with reference to FIG. 1, at the initial stage where the charging device 3 held on the stage 4 performs a charging process for charging the surface 14a of the high-resistance layer 14 of the depressed plate 1, the charging device 3 is placed close to the left end of the depressed plate 1 in the figure. In this state, the stage 4 is moved to move the charging device 3 and the three developing devices 2r, 2g and 2b in the direction of the arrow T, and the red developing device 2r, the green developing device 2g and the blue developing device 2b pass through the left end of the depressed plate 1 sequentially in this order after the charging device 3. In other words, the charging device 3 and the developing devices 2 pass in the same order at the same timing through each part along the direction of the arrow T of the depressed plate 1 as shown in FIGS. 13A to 13D.

As described above, in the charging process and respective color developing processes, it is necessary to control switching of voltages to be given to the many pattern electrodes 13 evenly spaced along the relative moving direction of the depressed plate 1 in accordance with the rule of each process. In other words, in each moving position of the stage 4, all pattern electrodes 13 placed in an area of the depressed plate 1 facing the charging device 3 are required to be switched to the low-level voltage (FIG. 13A), red pattern electrodes 13r placed in an area facing the red developing device 2r are required to be switched to the low-level voltage and the other pattern electrodes 13g and 13b are required to be switched to the high-level voltage (FIG. 13B), green pattern electrodes 13g placed in an area facing the green developing device 2g are required to be switched to the low-level voltage and the other pattern electrodes 13r and 13b are required to be switched to the high-level voltage (FIG. 13C), and blue pattern electrodes 13b placed in an area facing the blue developing device 2b are required to be switched to the low-level voltage and the other pattern electrodes 13r and 13g are required to be switched to the high-level voltage (FIG. 13D).

In the area of the depressed plate 1 facing the charging device 3, there are actually more pattern electrodes 13 arranged than those shown in FIG. 6. In the same way, in the areas facing the respective color developing devices 2, a large number of pattern electrodes 13 are arranged. Specifically, the diameter of the developing roller 23 is about 20 to 30 mm, while the pitch of the pattern electrodes 13 is about 0.1 mm. Therefore, the number of the pattern electrodes 13 in a nipple 26 between the develop roller 23 and the depressed plate 1 is about 30.

Actually, the voltage to be given to pattern electrodes 13 that have passed through the area of each process is controlled to be shifted one by one in accordance with the process rule. With this control, only by once moving the stage 4 relative to the depressed plate 1, all the color patterns 27, 28 and 29 can be developed, thereby enhancing the process speed substantially. In other words, as the method of this embodiment is adopted, the need to develop the respective color patterns 27, 28 and 29 independently is eliminated thereby to increase the process speed.

Figure 14:
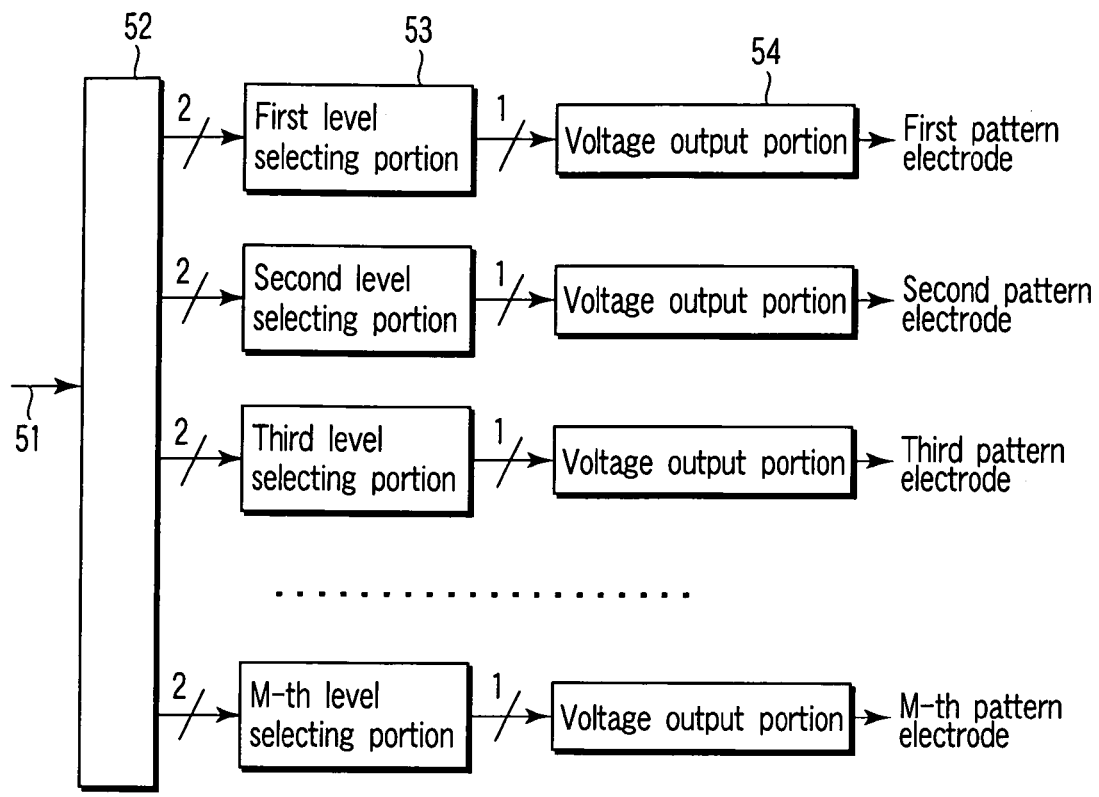
FIG. 14 is a block diagram for explaining the circuit structure of the power supply for realizing the operation explained in FIG. 13.

FIG. 14 is a block diagram showing the structure of a control circuit of the power supply 6 for switching voltages to be given to the many pattern electrodes 13 of the depressed plate 1.

When positional information 51 output from the controller 5 for moving the stage 4 is input to the power supply 6, this information is converted to a state signal indicating a process under execution of a corresponding pattern electrode 13 by a state converter 52, and the signal is outputs as a 2-bit signal by a corresponding level selecting portion 53 prepared for each pattern electrode 13. At this time, the positional information output from the controller 5 is an output signal from an encoder (not shown) provided on the stage 4 or an elapsed time from start of movement of the stage 4. In addition, the above-mentioned state signals output from the state converter 52 include four kinds of signals: (1) waiting state, (2) red developing process, (3) green developing process and (4) blue developing process. The waiting state (1) includes a charge process and each waiting state between processes.

Each level selecting portion 53 outputs to a corresponding voltage output portion 54 a signal of 1 bit for selecting a voltage of a level suitable for each process based on a state signal input from the state converter 52. Then, the voltage output portion 54 outputs to a corresponding pattern electrode 13 a voltage of the level suitable for the process. This voltage output portion 54 is equivalent to the switch 15 in the above-described embodiment and acts to switch the voltage between the two levels, that is, low and high.

The voltage output portion 54 can set any value of the voltage to be applied to the corresponding pattern electrode 13. For example, as the optimal intensity for the transferring electric field is determined based on the developer particle color in the liquid developer, the high-level voltage may be set to an optical value for the pattern electrodes 13r, 13g and 13b assigned to the respective colors. In this case, as each pattern electrode 13 is given a particular color, a voltage change rate may be predetermined as a specified value at the voltage output portion 54.

As described above, according to this embodiment, the voltage given to each of many pattern electrodes 13 of the depressed plate 1 is controlled to be switched in accordance with each process sequentially. Therefore, it is possible to perform the charging process and developing process of each color in parallel with each other, thereby increasing the process rate significantly and enhancing the operation rate of the apparatus.

Next description is given about a second embodiment of the present invention. In this embodiment, the unit for switching the voltage given to the pattern electrode 13 is different from that of the first embodiment, and the others are the same as those in the first embodiment. Hence, constituent elements having like functions are given the same reference numerals and its detailed explanation is omitted here. Particularly, the structure of the depressed plate 1 is completely the same as that of the first embodiment.

Figure 15:
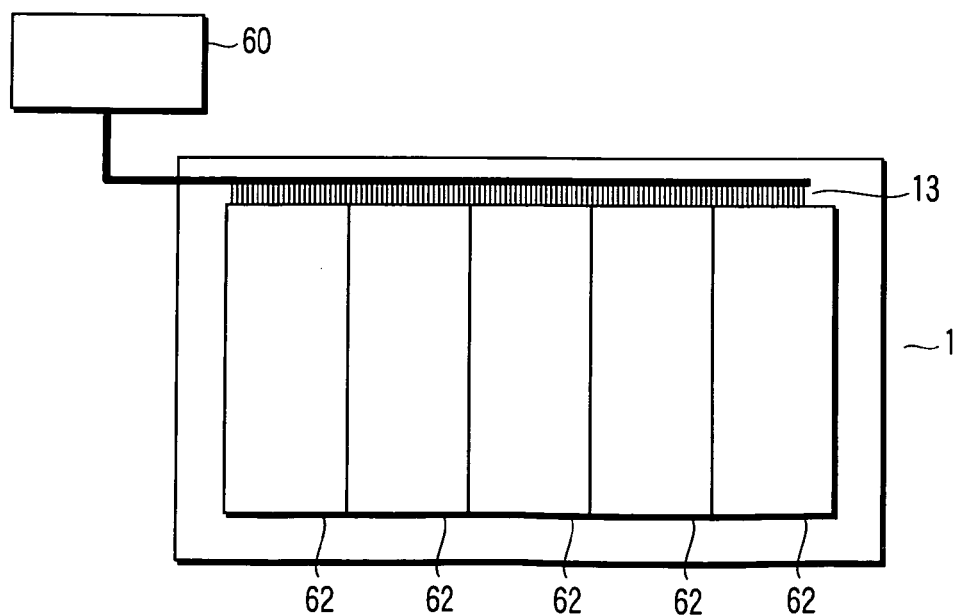
FIG. 15 is a schematic view of substantial parts of a pattern forming apparatus according to a second embodiment of the present invention.

FIG. 15 is an image view of all pattern electrodes 13 of the depressed plate 1 divided into plural blocks 62. Each block 62 only represents a control unit, and such block 62 does not exist in the actual depressed plate 1. In other words, in the above-mentioned first embodiment, the voltage given to each of the many pattern electrodes 13 is controlled to be switched independently; however, in this embodiment, the plural pattern electrodes 13 are controlled to be switched in block units.

Specifically, plural pattern electrodes 13 divided into one block 62 are applied to one particular process rule and given a voltage based on the same rule. In other words, all the pattern electrodes 13 in one block are given one particular process and not plural processes simultaneously.

Accordingly, it is necessary to always make any one of charging device 3 and developing devices $2r$, $2g$ and $2b$ act on the pattern electrodes 13 in one block 62 or make none of the devices act thereon. The number of pattern electrodes 13 that constitute one block 62 is determined depending on a distance between adjacent developing devices 2 and a pitch of pattern electrodes 13 arranged along the moving direction of the stage 4. When the distance between the adjacent developing devices 2 is L and the pitch of the pattern electrodes 13 is P, the number N of pattern electrodes 13 contained in one block 62 needs to satisfy the following equation:

$$N \leq L/P$$

Accordingly, the number B of blocks 62 dividing the depressed plate 1 needs to satisfy the following equation:

$$B = M/N \geq M(P/L)$$

Here, M in the above-mentioned equation indicates the total number of pattern electrodes 13. For example, when M=1920, L=32 mm and P=0.16 mm are given, the block number B needs to be 10 or more.

Figure 16:
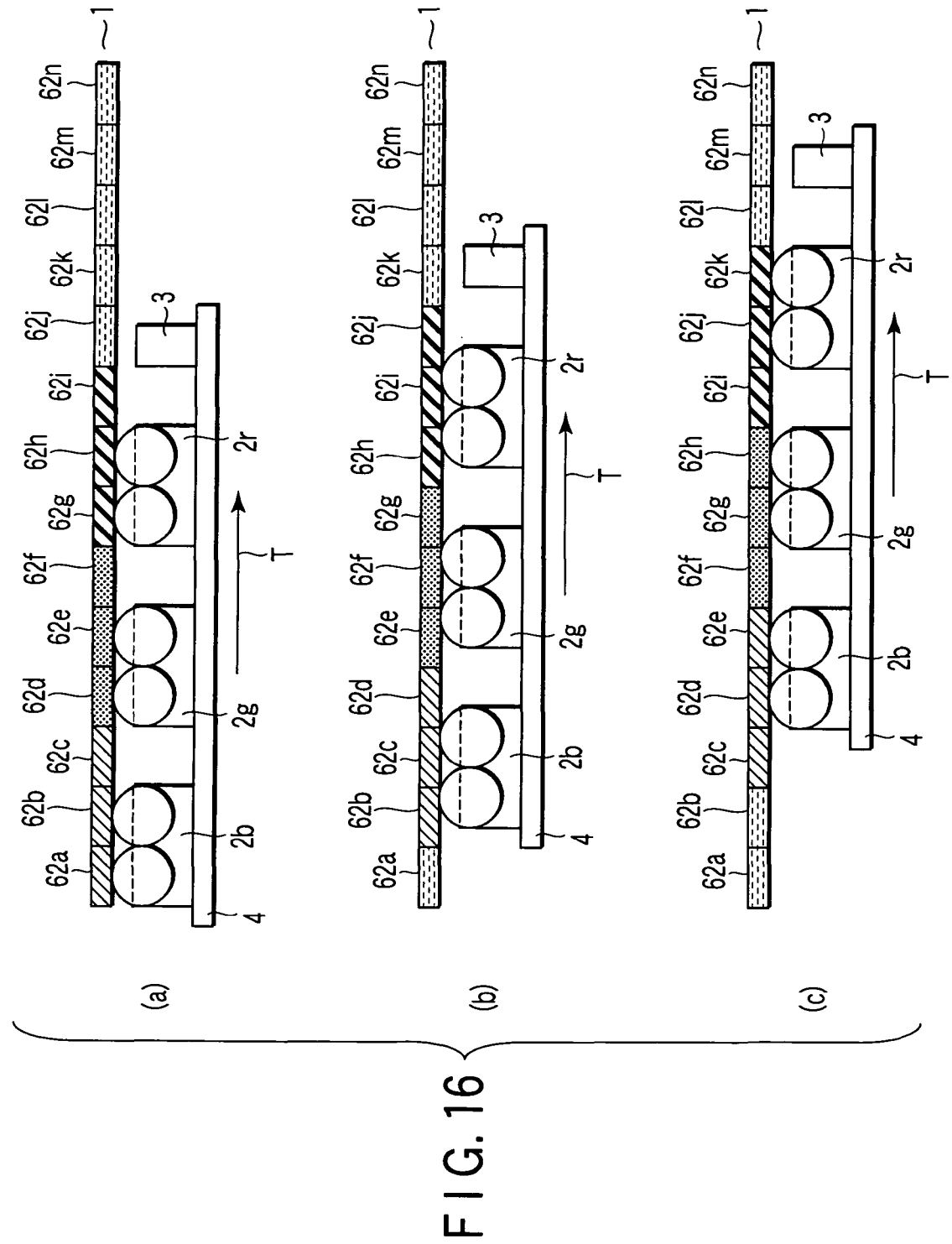
FIG. 16 is an operation explaining view for explaining the operation of the pattern forming apparatus of FIG. 15.

FIG. 16 shows an operation explaining view for explaining a specific example of the operation of this embodiment for controlling to switch the pattern electrodes 13 in block units. Here, the pattern electrode 13 of the depressed plate 1 are divided into fourteen blocks $62a$ to $62n$ as shown in the figure.

In a first state shown in FIG. 16A, the pattern electrodes 13 belonging to the tenth block $62j$ to the fourteenth block $62n$ from the left side in the figure are given a voltage corresponding to the charging process and all the pattern electrodes 13 are given a low-level voltage. In addition, the pattern electrodes 13 belonging to the seventh block $62g$ to the ninth block $62i$ are given a voltage corresponding to the red developing process and the red pattern electrodes $13r$ are given a low-level voltage and the other pattern electrodes $13g$ and $13b$ are given a high-level voltage. Further, the pattern electrodes 13 belonging to the fourth block $62d$ to the sixth block $62f$ are given a voltage corresponding to the green developing process and the green pattern electrodes $13g$ are given a low-level voltage and the other pattern electrodes $13r$ and $13b$ are given a high-level voltage. Furthermore, the pattern electrodes 13 belonging to the first block $62a$ to the third block $62c$ are given a voltage corresponding to the blue developing process and the blue pattern electrodes $13b$ are given a low-level voltage and the other pattern electrodes $13r$ and $13g$ are given a high-level voltage.

In other words, out of the tenth block $62j$ to the fourteenth block $62n$, blocks facing the charging device 3 are subjected to the charging process, blocks facing the red developing device $2r$ out of the seventh block $62g$ to the ninth block $62i$ are subjected to the red developing process, blocks facing the green developing device $2g$ out of the fourth block $62d$ to the sixth block $62f$ are subjected to the green developing process, blocks facing the blue developing device $2b$ out of the first block $62a$ to the third block $62c$ are subjected to the blue developing process, and all the processes for the depressed plate 1 are performed simultaneously.

Then, as shown in a second state of FIG. 16B, when the stage 4 is moved one block in the direction of the arrow T, a voltage applied to each pattern electrode 13 is switched in block units. That is, the pattern electrodes 13 belonging to the eleventh block $62k$ to the fourteenth block $62n$ are given a voltage for the charging process, the pattern electrodes 13 belonging to the eighth block $62h$ to the tenth block $62j$ are given a voltage corresponding to the red developing process, the pattern electrodes 13 belonging to the fifth block $62e$ to the seventh block $62g$ are given a voltage corresponding to the green developing process, and the pattern electrodes 13 belonging to the second block $62b$ to the fourth block $62d$ are given a voltage corresponding to the blue developing process. Here, the pattern electrodes 13 belonging to the first block $62a$ that has passed through the area allocated to the developing processes are given, for example, a low-level voltage.

Further, as shown in a third state of FIG. 16C, when the stage 4 is moved further one block in the direction of the arrow T, the potentials of the pattern electrodes 13 belonging to the blocks $62a$ to $62n$ are switched in block units in the same way. In this way, as the voltage switching control of all the pattern electrodes 13 is performed in block units, the control is simplified and the apparatus structure can be manufactured at lower costs.

Figure 17:
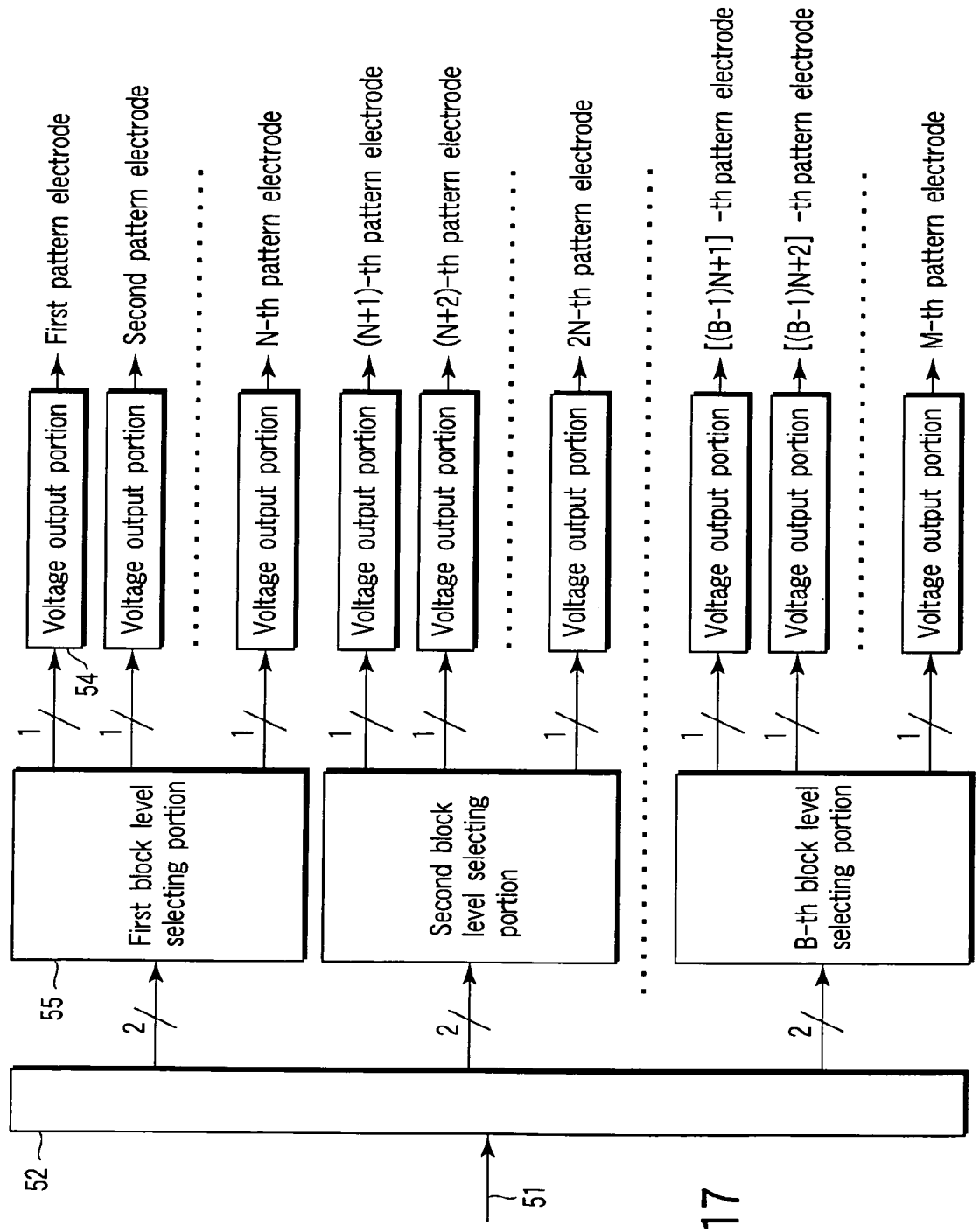
FIG. 17 is a block diagram for explaining a circuit structure of the power supply for realizing the operation explained in FIG. 15.

FIG. 17 is a block diagram of a control circuit provided in the power supply 6 for realizing switching control of this embodiment. Like the control circuit described with reference to FIG. 14, when the positional information 51 of the stage 4 is input from the controller 5, this positional information 51 is converted by the state converter 52 into a state signal of 2 bits indicating to which process each block 62 is allocated. This state signal is the same as that described with reference to FIG. 14.

An output signal of 2 bits converted by the state converter 52 is input to each block level selecting portion 55 and converted into a signal of 1 bit for selecting the low or high level corresponding to each process. Then, the signal is input to voltage output parts 54, which give the pattern electrodes 13 belonging to the blocks 62 voltages corresponding to the respective levels.

As described up to this point, as the voltages given to the all the pattern electrodes 13 of the depressed plate 1 are switched in block units, control load can be reduced significantly. More specifically, it is possible to reduce the signal data amount output from the state converter 52 to the level selecting portions 55. For example, if the number of the pattern electrodes 13 is 1920 and all of them are driven independently, the signal processing of 13 bits (11 bits +2 bits) is required. If the blocks are divided into 10 (B=10) and the pattern electrodes are driven in block units, the signal processing of only 6 bits (4 bits +2 bits) is required. This reduction in signal data amount makes it possible to realize the cost reduction for the controller and improvement of the signal processing rate.

Figure 18:
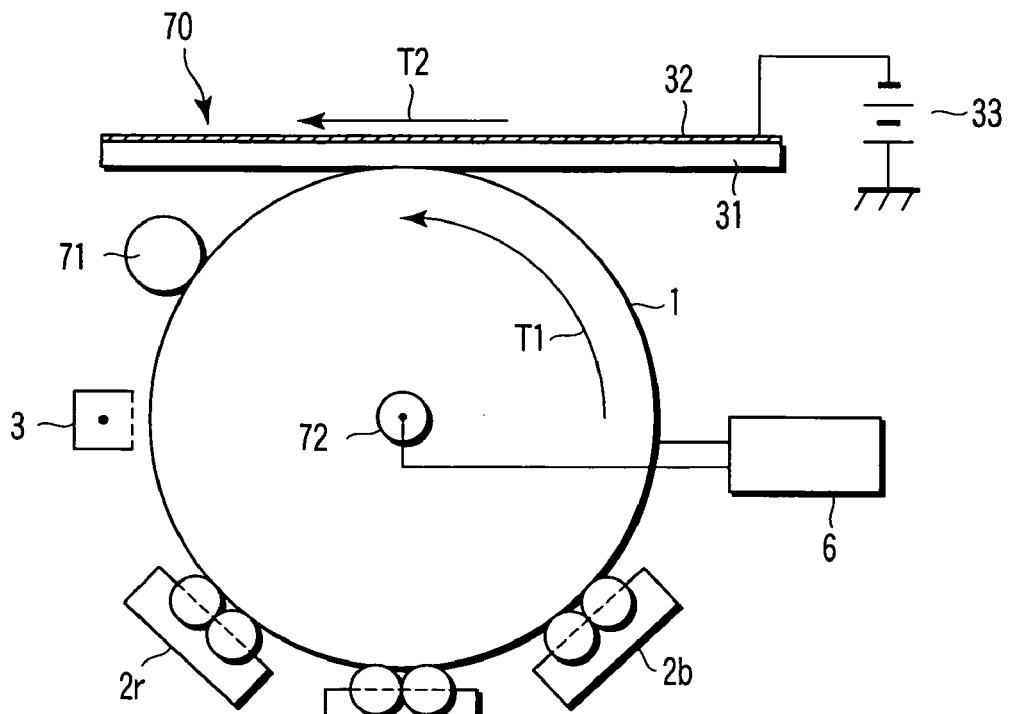
FIG. 18 is a schematic view illustrating a pattern forming apparatus according to a third embodiment of the present invention.

Next description is given about a pattern forming apparatus 70 according to a third embodiment of the present invention with reference to FIG. 18.

The pattern forming apparatus 70 has a drum-shaped depressed plate 1, a charging device 3, developing devices $2r$, $2g$ and $2b$ and a cleaner 71 which are arranged fixedly around the depressed plate 1. The depressed plate 1 is made of a conductive material such as aluminum, stainless steel or the like, and the structural elements shown in FIG. 2 are deposited on the surface of the depressed plate 1. Otherwise, the conductive drum may be used as a common electrode 12 and other structural elements may be formed into separate insulating sheets and wound around the conductive drum. The power supply 6 has embedded therein a controller according to the above-described first or second embodiment, and the controller receives, as positional information 51, a signal from an encoder 72 provided at the rotational axis of the depressed plate 1.

Then, around the depressed plate 1, between the blue developing device 2b and the cleaner 71, a transfer target medium 31 is arranged closely facing the depressed plate 1. At the facing position, the transfer operation is performed.

The operation of this pattern forming apparatus 70 is the same as that of the pattern forming apparatus according to the above-described first and second embodiment. That is, the surface 14a of the high-resistance layer 14 of the depressed plate 1 is charged by the charging device 3, and then, the red developing process, the green developing process and the blue developing process are performed sequentially, after which respective color patterns 27, 28 and 29 developed on the depressed parts 14b of the depressed plate 1 are collectively transferred on the transfer target medium 31. This is followed by the cleaner 71 removing remaining developer particles that are not transferred and remain on the surface of the depressed plate 1.

As described above, according to the present invention, each structural element of the pattern forming apparatus 70 can be operated without need to be moved. Therefore, it is possible to reduce loads of controlling the operation of the apparatus and preventing upsizing of the apparatus. In addition, as the charging process, the developing processes of respective colors, the transfer process and cleaning process are all performed simultaneously in parallel with each other, the process time can be reduced by a large amount.

The pattern forming apparatus 70 of this embodiment is different from those of the above-described first and second embodiments in that the charging device 3 and the developing devices 2r, 2g and 2b are fixed positionally. However, as the controller according to the present invention can be utilized by grasping the positional relations between the depressed plate 1 and each of these devices, it is possible in this embodiment to control switching of voltages given to the pattern electrodes 13 of the depressed plate 1 in the same method as the first and second embodiments.

Figure 19:
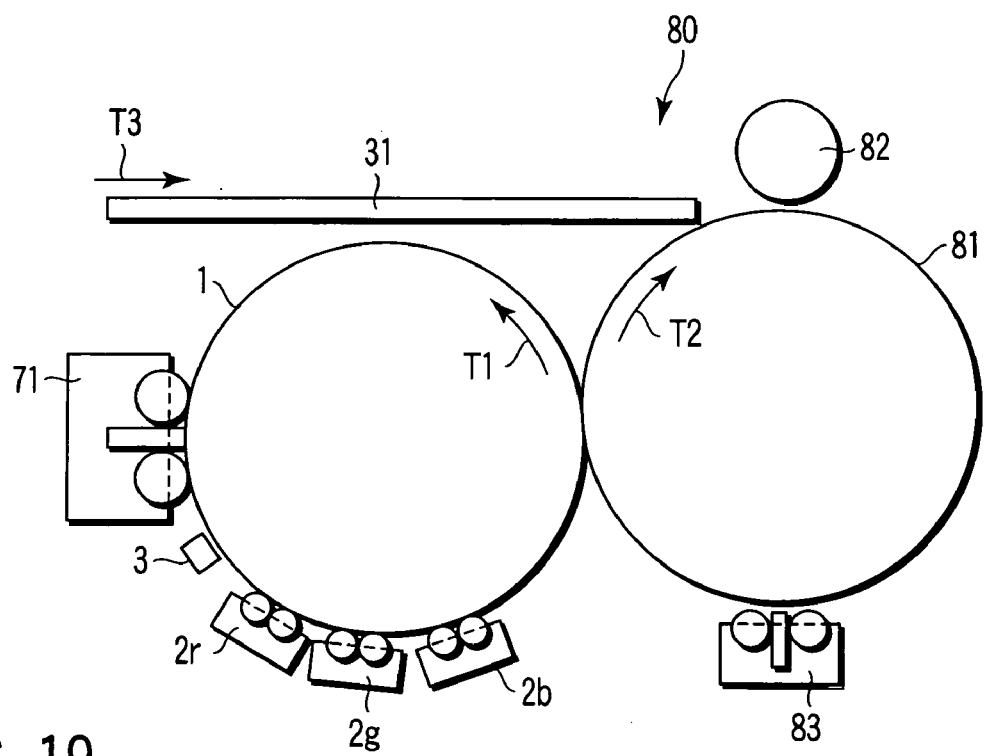
FIG. 19 is a schematic view for explaining a structure example using an intermediate transfer drum.

Here, the above-described third embodiment treats an apparatus of transferring the respective color patterns 27, 28 and 29 of the depressed plate 1 directly to the transfer target medium 31. However, the present invention is not limited to this apparatus, and the apparatus may be a pattern forming apparatus 80 shown in FIG. 19, for example, using an intermediate transfer drum 81.

In this case, the surface of the high-resistance layer of the depressed plate 1 is charged by the charging device 3, the respective color patterns 27, 28 and 29 are developed via the respective color developing devices 2r, 2g and 2b, and the respective color patterns 27, 28 and 29 are once transferred onto the intermediate transfer drum 81 arranged close to the peripheral surface of the drum-shaped depressed plate 1. Then, the respective color patterns 27, 28 and 29 transferred on the intermediate transfer drum 81 are transferred onto the transfer target medium 31 by the transfer roller 82. The peripheral surface of the intermediate transfer drum 81 is made of an elastic member, and after the patterns are transferred on the transfer target medium 31, the developer remaining on the peripheral surface is cleaned off by the cleaner 83.

Here, the present invention is not limited to the above-described embodiments just as they are, and can be embodied in various forms with modified structural elements, without departing from the scope of the present invention. In addition, any of the plural structural elements disclosed in the above-described embodiments may be combined to realize various forms of the present invention. For example, some of the structural elements may be eliminated from all the structural elements of the above-described embodiments. Furthermore, the structural elements of different embodiments may be combined appropriately.

For example, the above-described embodiments treat a case of moving any one of the depressed plate, the intermediate transfer body and the transfer target medium relative to the others. However, the present invention is not limited to the case, and the facing two members may be moved relative to each other.

Further, the above-described embodiments treat a case of operating the pattern forming apparatus by positively charging the developer particles. However, the present invention is not limited to the case, and the apparatus may be operated by charging all the structural elements with negative polarity.

Furthermore, the above-described embodiments treat a case where the present invention is applied to an apparatus of forming a phosphor layer or a color filter on the front surface substrate of the flat panel display. However, the present invention can be widely used in a manufacturing apparatus of any other technical field.

For example, if the composition of the liquid developer is changed, the present invention can be applied to an apparatus of forming a conductive pattern in an IC tag or circuit board. In such a case, if the liquid developer is composed of resin particles having an average particle diameter of 0.3 µm, metal fine particles having an average particle diameter of 0.02 µm and adhered to the resin particle surface (for example, copper, palladium, silver or the like) and charge control material such as metal soap, the same method as that of the above-described embodiments can be used to form a wiring pattern with the developer, for example, on a silicon wafer. In general, it is not easy to form a circuit pattern having enough conductivity only with the developer. Therefore, it is preferable to use the above-mentioned metal fine particles as a basis to apply a coating after the pattern forming. This can be used to perform patterning of a resistor, condenser, conductive circuit and the like.

As the pattern forming apparatus according to the present invention has the above-described structure and operation, the thick film pattern can be formed with high resolution and high accuracy and the processing time required for the developing processes can be reduced and the operating rate of the apparatus can be increased.

What is claimed is:
1. A pattern forming apparatus comprising:
  a plate having a plurality of pattern electrodes arranged electrically isolated from each other;
  a power supply which applies voltages to said plurality of pattern electrodes independently;
  a first developing device which supplies the plate via a first supplying member with a first liquid developer which is insulating liquid having charged first developer particles in suspension and uses a first electric field formed between the first supplying member and a first pattern electrode given a first voltage by the power supply to gather the first developer particles in the first liquid developer at the first pattern electrode to perform development;

a second developing device which supplies the plate via a second supplying member with a second liquid developer which is insulating liquid having charged second developer particles in suspension and uses a second electric field formed between the second supplying member and a second pattern electrode given a second voltage by the power supply to gather the second developer particles in the second liquid developer at the second pattern electrode to perform development;

a transfer device which forms a third electric field between the first pattern electrode and the second pattern electrode and a transfer target medium while the plate of which the first developer particles are gathered and developed on the first pattern electrode and the second developer particles are gathered and developed on the second pattern electrode is placed opposed to the transfer target medium, and transfers the first developer particles gathered on the first pattern electrode and the second developer particles gathered on the second pattern electrode onto the transfer target medium;

wherein the pattern electrodes are arranged in such a manner that the first pattern electrode and the second pattern electrode are arranged alternately in an alignment direction of the pattern electrodes;

wherein a moving mechanism which moves a stage holding the first developing device and the second developing device and the plate relative to each other in the alignment direction in which the first pattern electrode and the second pattern electrode are arranged alternately;

wherein the power supply controls switching of the voltages to be applied to said plurality of pattern electrodes based on relative positional information between the first and second developing devices and the plate;

wherein the power supply controls switching of the voltages to be applied to all the pattern electrodes sequentially based on the relative positional information so as to apply the first voltage to the first pattern electrode in a first area of the depressed plate opposed to the first developing device and to apply to other pattern electrodes in the first area a fourth voltage for forming a fourth electric field reverse to the first electric field between the other pattern electrodes and the first supplying member and so as to apply the second voltage to the second pattern electrode in a second area of the depressed plate opposed to the second developing device and to apply to other pattern electrodes in the second area a fifth voltage for forming a fifth electric field reverse to the second electric field between the other pattern electrodes and the second supplying member;

wherein the pattern electrodes are divided into blocks so that each of the block contains a fixed number of pattern electrodes and the power supply controls the voltages to be given to the pattern electrodes in block units; and wherein when a distance between the first developing device and the second developing device is L and a pitch between the pattern electrodes is P, the fixed number N satisfies $N \leqq L/P$.

* * * * *